(12) United States Patent
Iskander et al.

(10) Patent No.: US 6,496,047 B1
(45) Date of Patent: Dec. 17, 2002

(54) SOLID STATE SWITCH WITH PULSED CONTROL

(75) Inventors: Stephen Mark Iskander, Chelmsford (GB); Robert Richardson, Chelmsford (GB)

(73) Assignee: EEV Liimited, Essex (GB)

( * ) Notice: Subject to any disclaimer, the term of this patent is extended or adjusted under 35 U.S.C. 154(b) by 0 days.

(21) Appl. No.: 09/339,021

(22) Filed: Jun. 23, 1999

(30) Foreign Application Priority Data

Jun. 23, 1998 (GB) .............................................. 9813382

(51) Int. Cl.$^7$ .............................................. H03K 3/017
(52) U.S. Cl. ........................ 327/177; 327/109; 327/436
(58) Field of Search ................................ 327/109, 110, 327/177, 181, 403, 404, 423, 443, 448, 494, 496, 436

(56) References Cited

U.S. PATENT DOCUMENTS

| | | | | |
|---|---|---|---|---|
| 4,038,568 A | * | 7/1977 | May et al. ..................... 327/72 |
| 4,425,518 A | | 1/1984 | Milberger .................... 327/436 |
| 4,511,815 A | | 4/1985 | Wood .......................... 327/436 |
| 4,577,166 A | * | 3/1986 | Milberger et al. .......... 327/181 |
| 4,694,206 A | * | 9/1987 | Weinberg .................... 327/427 |
| 4,774,419 A | * | 9/1988 | D'Ariano .................... 327/109 |
| 4,866,556 A | | 9/1989 | Hebenstreit ................. 361/91 |
| 4,937,470 A | * | 6/1990 | Zeiler .......................... 327/109 |
| 5,132,553 A | * | 7/1992 | Siegel ......................... 327/109 |
| 5,276,357 A | * | 1/1994 | Cripe .......................... 327/109 |
| 5,304,863 A | | 4/1994 | Cargille ....................... 327/110 |
| 5,594,378 A | * | 1/1997 | Kruse et al. ................. 327/177 |
| 5,684,426 A | * | 11/1997 | De Doncker ................ 327/440 |
| 5,741,303 A | * | 4/1998 | Kroll et al. ..................... 607/5 |
| 5,763,962 A | | 6/1998 | Tsurumi ...................... 327/377 |
| 5,859,519 A | * | 1/1999 | Archer ........................ 318/801 |
| 5,913,877 A | * | 6/1999 | Kroll et al. ..................... 607/5 |

FOREIGN PATENT DOCUMENTS

| | | |
|---|---|---|
| DE | 3243660 | 6/1983 |
| EP | 0211700 | 6/1985 |
| EP | 0724332 | 7/1996 |
| EP | 0782266 | 7/1997 |
| WO | WO93/11609 | 11/1992 |

OTHER PUBLICATIONS

Oicles J. A. et al. "High Performance Modulators Using Mosfets" vol. SYMP. 18, 1988, pp. 34–38.

* cited by examiner

Primary Examiner—Timothy P. Callahan
Assistant Examiner—An T. Luu
(74) Attorney, Agent, or Firm—Donald C. Casey, Esq.

(57) ABSTRACT

In a switching arrangement, a plurality of modules are connected such that the main switching elements, FETs, are in series. Control of and power to the FETs is supplied via a single turn primary passing through a plurality of toroidal secondary transformers. A train of control pulses is applied to the single turn primary and their polarity determines whether the main FET is switched on or off, the length of the pulse train determining the pulse width and PRF of the output of the switching arrangement. The control pulses are also used to supply power to the main driver of the main FET.

14 Claims, 2 Drawing Sheets

SOLID STATE SWITCH WITH PULSED CONTROL

FIELD OF THE INVENTION

This invention relates to a switching arrangement and more particularly, but not exclusively, to a switching arrangement used in a pulse modulator for providing pulses of variable length and pulse repetition frequency (PRF).

BACKGROUND OF THE INVENTION

A requirement exists for pulse modulator test equipment which is suitable for supplying variable output, with operating voltages, of say up to 30 kV, duty cycles in the range of less than 1% and up to greater than 30%, pulse widths in the range of 15 ns to greater than 100 microseconds and PRFs up to 750 kHz. In conventional arrangements, a pulse transformer would be used as a modulator for driving rf sources. However, it would be difficult to design a pulse transformer which could meet the demanding requirements outlined above.

The present invention seeks to provide a switching arrangement and particularly a switching arrangement suitable for driving rf sources for test purposes. However, it is envisaged that the arrangement may also be suitable for use in other non-test applications where demanding switching requirements exist.

SUMMARY OF THE INVENTION

According to the invention, there is provided a switching arrangement comprising a solid state switch and control means arranged to apply control pulses to the solid state switch, such that when pulses of one polarity are applied, the switch is maintained in an on state and when pulses of the other polarity are applied, the switch is maintained in an off state.

Thus, by controlling the duration of the pulse train and its polarity, the switch can be controlled to give an output having characteristics which are variable over wide ranges, giving great versatility. For example, the PRF may be varied so as to give anything from a dc output to a frequency of 750 kHz. Providing pulses of one polarity continue to be applied, the switch will remain in its maintained state. The invention is thus particularly applicable for use in test equipment.

In a preferred arrangement, the control pulses are used to supply power to the switch drive circuitry. Advantageously, the switch is a power FET.

In a preferred arrangement, an H-bridge circuit is included to generate the control pulses, the H-bridge circuit including the primary winding of a transformer, and a secondary of the transformer being connected to the switch.

In a particularly advantageous arrangement, a plurality of switches are included, each switch having a respective different secondary winding connected thereto and there being a common single primary. This enables the switches to be controlled and powered simultaneously with a single input.

According to a feature of the invention, a pulse modulator includes a switch arrangement in accordance with the invention, and in another feature of the invention, test equipment includes a pulse modulator including the switching arrangement also. The invention is particularly advantageously applicable to test equipment where it is often necessary to be able to produce a wide range of outputs having very different characteristics.

BRIEF DESCRIPTION OF THE DRAWINGS

One way in which the invention may be performed is now described by way of example with reference to the accompanying drawings in which.

DESCRIPTION OF A PREFERRED EMBODIMENT

Figure 1:
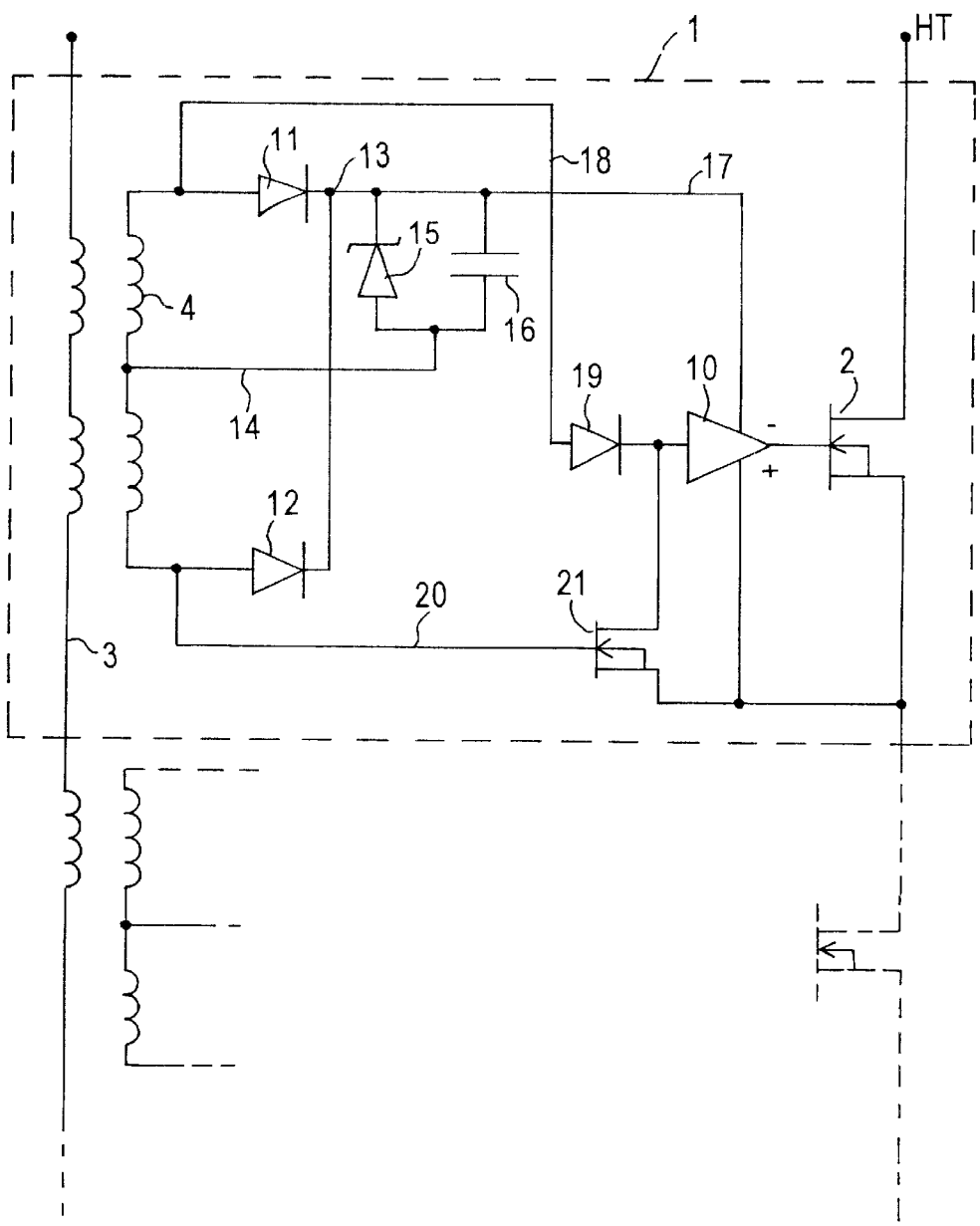
FIG. 1 is a schematic circuit diagram of a pulse modulator including a switching arrangement in accordance with the invention.

With reference to FIG. 1, a switching arrangement comprises twenty identical modules, one module 1 being shown in greater detail. The module 1 includes a main FET 2 which is the main switching element, the main FET of each of the modules being connected in series with one another as indicated. The modules are arranged in a stack, this modular arrangement being particularly suitable for convection cooling with either air or fluid.

The power for the FET 2 and its control signals are supplied from an isolated single turn primary 3 which passes through a toroidal secondary transformer 4 included in the module 1 and also through similar toroidal transformers included in each of the other modules. Thus the input supplied on the common single turn primary 3 is applied to each of the modules in parallel.

Figure 2:
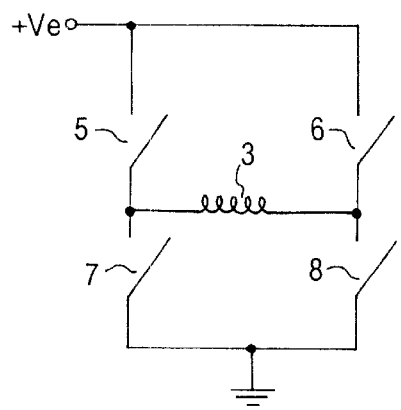
FIG. 2 is a schematic diagram of an H-bridge circuit used to produce pulses to be supplied to the arrangement shown in FIG. 1.

The signal on the primary 3 comprises a plurality of pulses generated at an H-bridge circuit arrangement as shown in FIG. 2. This comprises four FET switches 5, 6, 7 and 8 connected between ground and a positive voltage supply at 9. FETs 5 and 7 are connected in series between the input 9 and ground as are FETs 6 and 8. The single turn primary 3 is connected at one end between FETs 5 and 7 and at its other end between FETs 6 and 8.

Figure 3:
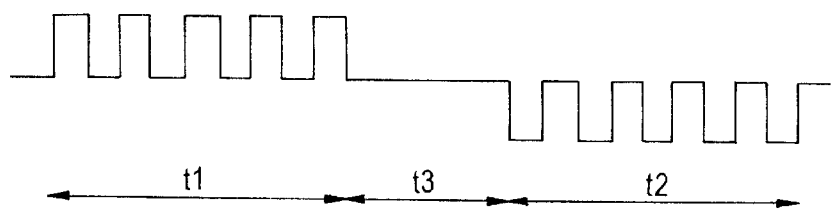
FIGS. 3 and 4 are pulse diagrams illustrating the operation of the arrangement of FIG. 1.

When the circuit is inactive, each of the FETs 5 to 8 is open as shown. When it is wished to switch on the main FET 2 in module 1, and corresponding FETs in the other modules, FETs 5 and 8 are closed. The input 9 is pulsed to give a series of positive pulses through the primary 3 as shown in period t1 in FIG. 3. When it is required to switch off the main FET 2 in module 1, following a reset period during which FETs 7 and 8 only for the H-bridge circuit of FIG. 2 are closed, the switch configuration is changed so as to close FETs 6 and 7 and open FETs 5 and 8, changing the direction of current flow through the single primary 3 and giving a series of negative polarity pulses as shown in period t2 in FIG. 3. FIG. 3 shows the signals applied to the primary 3. The reset period t3 between period t1 and t2 although shown in FIG. 3 as being relatively large compared to the pulse width may in reality be quite short. It is only necessary for it to be sufficiently long to reset the transformer 4. Typically each pulse in the pulse trains illustrated in FIG. 3 has a pulse width of 1 microsecond. The FETs 5 to 8 are switched by a control processor (not shown) so as to achieve the desired operation of the main FET 2 of module 1 and the other main FETs. Thus the width and prf of the output and the rate of rise of the output to a load may be controlled. Thus in test equipment, the test parameters, including operating level, can be electronically controlled, making test selection and calibration very simple.

With reference to FIG. 1, the pulse as shown in FIG. 3 are applied via the primary 3 to the toroidal transformer 4 in module 1. These pulses are used to provide a power supply to the driver 10 of the main FET 2. The ends of the secondary 4 are connected via diodes 11 and 12 at 13 and a central tap 14 is connected via a Zener diode 15 and capacitor 16 is parallel to give a power supply to the driver 10 on line 17.

Figure 4:
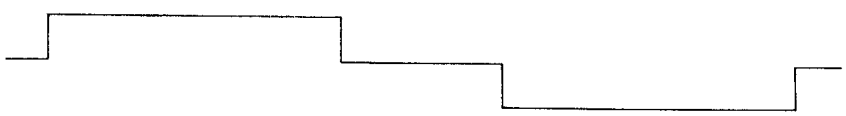

The control pulses applied via the single primary 3 also control the operation of the FET 2 enabling it to be switched off or on as required. When the pulses have positive polarity, as shown at the time t1 in FIG. 3, the train of control pulses is applied via line 18 from one end of the secondary 4 via a diode 19 to the driver 10 of the main FET 2. This causes the FET 2 to remain switched on during the entire period that the train of pulses is applied to the driver 10. When the FET 2 is to be switched off, the negative pulses as shown in t2 of FIG. 3 are applied to the single primary 3. These give a train control pulses on line 20 and the other end of the secondary 4 which are applied via another FET 21 to the driver 10. The FET 2 then remains switched off for as long as the pulses continue to be applied to the driver 10. FIG. 4 shows the FET trigger signal produced from the pulse train illustrated in FIG. 3.

Thus, by varying the length and polarity of the pulse train, control of the switching of the main FET is accomplished. The pulse repetition frequency and pulse length can be controlled over a very wide range.

Figure 5:
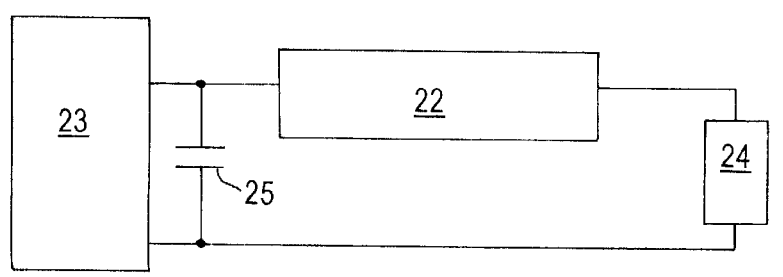
FIG. 5 schematically shows a modulator circuit including a switching arrangement as shown in FIG. 1.

FIG. 5 illustrates schematically a modulator incorporating the switching arrangement illustrated in FIG. 1 and shown at 22. This is connected to a dc supply 23, load 24 and a reservoir capacitor 25. This arrangement permits the dc supply 23, the load 24 and capacitor 25 to have one terminal common to each, minimising the displacement current in the stray capacitance, and hence reducing loss and maximising switching speed.

We claim:

1. A switching arrangement comprising: a solid state switch; and control means arranged to apply a continuous train of control pulses to said solid state switch, such that when a train of pulses of one polarity is applied, said switch is maintained in an on state only so long as said train is applied and when said train of pulses of the other polarity is applied, said switch is maintained in an off state only so long as said train of pulses of the other polarity is applied.

2. An arrangement as claimed in claim 1 wherein the control pulses are used to supply power to said switch.

3. An arrangement as claimed in claim 1 wherein said switch is a power FET.

4. An arrangement as claimed in claim 1 and including a transformer having a primary and a secondary, wherein said control means includes an H-bridge circuit to generate the control pulses, said circuit including said primary of said transformer and said secondary being connected to said switch.

5. An arrangement as claimed in claim 1 and including a transformer, and a plurality of solid state switches, each switch of said plurality having a respective different secondary of said transformer connected thereto and a common single primary of said transformer.

6. An arrangement as claimed in claim 5 wherein the secondary windings are toroidal.

7. An arrangement as claimed in claim 5 wherein said plurality of solid state switches are connected in series.

8. A pulse modulator including a switching arrangement comprising: a solid state switch; and control means arranged to apply a continuous train of control pulses to said solid state switch, such that when said train of pulses of one polarity is applied to said switch is maintained in an on state only so long as said train is applied and when said train of pulses of the other polarity is applied said switch is maintained in an off state only so long as said train of pulses of the other polarity is applied.

9. A pulse modulator as claimed in claim 8 wherein the control pulses are used to supply power to drive said switch.

10. A pulse modulator as claimed in claim 8 and including a transformer having a primary and a secondary, wherein said control means includes an H-bridge circuit to generate the control pulses, said circuit including said primary of said transformer and said secondary being connected to said switch.

11. A pulse modulator as claimed in claim 8 and including a transformer, and a plurality of solid state switches, each switch of said plurality having a respective different secondary of said transformer connected thereto and a common single primary of said transformer.

12. A pulse modulator as claimed in claim 8 wherein the secondary windings are toroidal.

13. A pulse modulator as claimed in claim 8 wherein said plurality of solid state switches are connected in series.

14. A test arrangement including a pulse modulator as claimed in claim 8 wherein the modulator switching arrangement is controlled by controlling the duration and polarity of said pulse train to provide a predetermined output to said test arrangement.

* * * * *